(12) United States Patent
DenBaars et al.

(10) Patent No.: US 7,994,527 B2
(45) Date of Patent: Aug. 9, 2011

(54) HIGH LIGHT EXTRACTION EFFICIENCY LIGHT EMITTING DIODE (LED)

(75) Inventors: Steven P. DenBaars, Goleta, CA (US); Shuji Nakamura, Santa Barbara, CA (US); Hisashi Masui, Santa Barbara, CA (US); Natalie Nichole Fellows, Santa Barbara, CA (US); Akihiko Murai, Goletz, CA (US)

(73) Assignee: The Regents of the University of California, Oakland, CA (US)

( * ) Notice: Subject to any disclaimer, the term of this patent is extended or adjusted under 35 U.S.C. 154(b) by 153 days.

(21) Appl. No.: 11/593,268

(22) Filed: Nov. 6, 2006

(65) Prior Publication Data

US 2007/0102721 A1    May 10, 2007

Related U.S. Application Data

(60) Provisional application No. 60/734,040, filed on Nov. 4, 2005.

(51) Int. Cl.
  *H01L 33/00* (2010.01)
(52) U.S. Cl. ....... 257/98; 257/95; 257/99; 257/E33.073; 438/29; 438/22; 362/326
(58) Field of Classification Search ............ 257/79–103, 257/E33.073; 438/22, 29; 362/326
  See application file for complete search history.

(56) References Cited

U.S. PATENT DOCUMENTS

| | | | |
|---|---|---|---|
| 3,607,463 A | 9/1971 | Kinoshita et al. | |
| 5,087,949 A * | 2/1992 | Haitz | 257/79 |
| 5,696,389 A | 12/1997 | Ishikawa et al. | |
| 5,775,792 A * | 7/1998 | Wiese | 362/328 |
| 5,932,048 A | 8/1999 | Furukawa et al. | |
| 6,155,699 A | 12/2000 | Miller et al. | |
| 6,357,889 B1 | 3/2002 | Duggal et al. | |
| 6,417,019 B1 * | 7/2002 | Mueller et al. | 438/29 |
| 6,547,423 B2 * | 4/2003 | Marshall et al. | 362/333 |
| 6,569,544 B1 | 5/2003 | Alian et al. | |
| 6,573,537 B1 | 6/2003 | Steigerwald et al. | |
| 6,649,939 B1 * | 11/2003 | Wirth | 257/95 |
| 6,717,362 B1 * | 4/2004 | Lee et al. | 313/512 |
| 6,746,295 B2 | 6/2004 | Sorg | |
| 6,784,460 B2 * | 8/2004 | Ng et al. | 257/95 |
| 6,998,281 B2 | 2/2006 | Taskar et al. | |
| 7,053,419 B1 * | 5/2006 | Camras et al. | 257/98 |
| 7,098,589 B2 | 8/2006 | Erchak et al. | |

(Continued)

FOREIGN PATENT DOCUMENTS

DE    19807758    12/1998

(Continued)

OTHER PUBLICATIONS

Fujii, T. et al., "Increase in the extraction efficiency of GaN-based light-emitting diodes via surface roughening," Appl. Phys. Lett. 2004, pp. 855-857, vol. 84(6).

(Continued)

*Primary Examiner* — Keisha R Bryant
*Assistant Examiner* — Eric Ward
(74) *Attorney, Agent, or Firm* — Gates & Cooper LLP

(57) ABSTRACT

An (Al, Ga, In)N and ZnO direct wafer bonded light emitting diode (LED) combined with a shaped plastic optical element, in which the directional light from the ZnO cone, or from any high refractive index material in contact with the LED surface, entering the shaped plastic optical element is extracted to air.

20 Claims, 11 Drawing Sheets

U.S. PATENT DOCUMENTS

| | | | |
|---|---|---|---|
| 7,119,271 | B2 | 10/2006 | King et al. |
| 7,223,998 | B2 | 5/2007 | Schwach et al. |
| 7,268,371 | B2 * | 9/2007 | Krames et al. .................. 257/98 |
| 7,329,982 | B2 * | 2/2008 | Conner et al. ................ 313/498 |
| 7,390,117 | B2 * | 6/2008 | Leatherdale et al. ......... 362/555 |
| 7,525,126 | B2 * | 4/2009 | Leatherdale et al. ........... 257/98 |
| 7,541,610 | B2 * | 6/2009 | Haase ............................. 257/13 |
| 2002/0123204 | A1 | 9/2002 | Torvik |
| 2003/0215766 | A1 | 11/2003 | Fischer et al. |
| 2004/0046179 | A1 | 3/2004 | Baur |
| 2004/0079408 | A1 | 4/2004 | Fetzer et al. |
| 2004/0211970 | A1 | 10/2004 | Hayashimoto et al. |
| 2005/0029528 | A1 | 2/2005 | Ishikawa |
| 2005/0082562 | A1 | 4/2005 | Ou et al. |
| 2005/0111240 | A1 * | 5/2005 | Yonekubo ..................... 362/617 |
| 2005/0156510 | A1 | 7/2005 | Chua et al. |
| 2005/0189551 | A1 | 9/2005 | Peng et al. |
| 2005/0205884 | A1 | 9/2005 | Kim et al. |
| 2006/0008941 | A1 * | 1/2006 | Haskell et al. ................... 438/93 |
| 2006/0009006 | A1 | 1/2006 | Murai et al. |
| 2006/0175624 | A1 | 8/2006 | Sharma et al. |
| 2006/0192217 | A1 | 8/2006 | David et al. |
| 2006/0194359 | A1 | 8/2006 | Weisbuch et al. |
| 2006/0202226 | A1 | 9/2006 | Weisbuch et al. |
| 2006/0234486 | A1 | 10/2006 | Speck et al. |
| 2006/0246722 | A1 | 11/2006 | Speck et al. |
| 2007/0001186 | A1 | 1/2007 | Murai et al. |
| 2007/0085100 | A1 | 4/2007 | Diana et al. |
| 2007/0114549 | A1 * | 5/2007 | Yu .................................. 257/98 |
| 2007/0257267 | A1 * | 11/2007 | Leatherdale et al. ........... 257/79 |
| 2007/0257271 | A1 * | 11/2007 | Ouderkirk et al. ............. 257/98 |
| 2007/0284603 | A1 * | 12/2007 | Haase ............................. 257/98 |
| 2008/0012034 | A1 * | 1/2008 | Thielen et al. .................. 257/98 |
| 2008/0030974 | A1 * | 2/2008 | Abu-Ageel ..................... 362/19 |

FOREIGN PATENT DOCUMENTS

| | | |
|---|---|---|
| EP | 1081771 | 3/2001 |
| EP | 1536487 | 6/2005 |
| JP | 2003016808 | 1/2003 |
| WO | WO2005/064666 | 7/2005 |
| WO | 2005083037 | 9/2005 |

OTHER PUBLICATIONS

Jasinski, J. et al., "Microstructure of GaAs/GaN interfaces produced by direct wafer fusion," Appl. Phys. Lett. 2002, pp. 3152-3154, vol. 81(17).

Kish, F.A. et al., "Very high-effficiency semiconductor wafer-bonded . . . diodes," Appl. Phys. Lett. 1994, pp. 2839-2841, 64(21).

Liau, Z.L. et al., "Wafer fusion: A novel technique for optoelectronic device fabrication and monolithic integration," Appl. Phys. Lett. 1990, pp. 737-739, 56(8).

Murai, A. et al., "Wafer Bonding of GaN and ZnSSe for Optoelectronic Applications," Jpn. J. of Appl. Phys. 2004, pp. L1275-L1277, vol. 43(10A).

Nakahara, K. et al., "Improved External Efficiency InGaN-Based Light-Emitting Diodes with Transparent Conductive Ga-Doped ZnO as p-Electrodes," Jpn. J. of Applied Physics 2004, pp. L180-L182, vol. 43(2A).

Nakamura, S. et al., "High-Brightness InGaN Blue, Green and Yellow Light-Emitting Diodes with Quantum Well Structures," Jpn. J. Appl. Phys. 1995, L797-L799, vol. 34(Part 2, 7A).

International Search Report, International application No. PCT/US06/43317, International filing date Nov. 6, 2006.

European Extended Search Report dated Dec. 1, 2010 (EP Application No. 06837048.5.

Murai, Akihiko, et al., "Hexagonal pyramid shaped light-emitting diodes based on ZnO and GaN direct wafer bonding", Applied Physics Letters, AIP, American Institute of Physics, Mellville, NY, US, vol. 89, No. 17, Oct. 26, 2006, pp. 171116-1-171116-3, XP12086524, ISSN: 0003-6951.

* cited by examiner

HIGH LIGHT EXTRACTION EFFICIENCY LIGHT EMITTING DIODE (LED)

CROSS-REFERENCE TO RELATED APPLICATIONS

This application claims the benefit under 35 U.S.C Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),"

which application is incorporated by reference herein.

This application is related to the following co-pending and commonly-assigned applications:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING", which application claims the benefit under 35 U.S.C Section 365(c) of PCT Application Ser. No. US2003/03921, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING", U.S. Utility application Ser. No. 11/054,271, filed on Feb. 9, 2005, by Rajat Sharma, P. Morgan Pattison, John F. Kaeding, and Shuji Nakamura, entitled "SEMICONDUCTOR LIGHT EMITTING DEVICE", U.S. Utility Application Serial No. 10/938,704, filed on Sep. 10, 2004, by Carole Schwach, Claude C. A. Weisbuch, Steven P. DenBaars, Henri Benisty and Shuji Nakamura, entitled "WHITE, SINGLE OR MULTICOLOR LED BY RECYCLING GUIDED MODES", now U.S. Patent No.7,223,998, issued May 29, 2007;

U.S. Utility application Ser. No. 11/175,761, filed on Jul. 6, 2005, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS", now U.S. Patent No. 7,344,958, issued Mar. 18, 2008, which application claims the benefit under 35 U.S.C Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al, In, Ga)N and Zn(S, Se) FOR OPTOELECTRONICS APPLICATIONS", U.S. Utility application Ser. No. 11/067,957, filed Feb. 28, 2005, by Claude C. A. Weisbuch, Aurelien J. F. David, James S. Speck and Steven P. DenBaars, entitled "HORIZONTAL EMITTING, VERITCAL EMITTING, BEAM SHAPED, DISTRIBUTED FEEDBACK (DFB) LASERS BY GROWTH OVER A PATTERNED SUBSTRATE,", now U.S. Pat. No. 7,345,298, issued Mar. 18, 2008;

U.S. Utility application Ser. No. 11/067,910, filed Feb. 28, 2005, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE,", now U.S. Pat. No. 7,291,864, issued Nov. 6, 2007;

U.S. Utility application Ser. No. 11/067,956, filed Feb. 28, 2005, by Aurelien J.F. David, Claude C.A Weisbuch and Steven P. DenBaars, entitled "HIGH EFFICIENCY LIGHT EMITTING DIODE (LED) WITH OPTIMIZED PHOTONIC CRYSTAL EXTRACTOR,";

U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (AL, IN, GA)N WAFERS,"which application claims the benefit under 35 U.S.C Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (AL, IN, GA)N WAFERS,";

U.S. Utility application Ser. No. 11/403,288, filed Apr. 13, 2006, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS,", which application claims the benefit under 35 U.S.C Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (AL, IN, GA)N LAYERS,";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD,", which application claims the benefit under 35 U.S.C Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al, Ga, In)N AND ZnO DIRECT WAFER BONDING STRUCTURE FOR OPTOELECTRONIC APPLICATIONS, AND ITS FABRICATION METHOD,", U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al, Ga, In)N AND ZnO DIRECT WAFER BONDED STRUCTURE FOR OPTOELECTRONIC APPLICATIONS, AND ITS FABRICATION METHOD,", and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD,";

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES,";

U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH,";

U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED),";

U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),";

U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B)N OPTOELECTRONIC DEVICES,";

U.S. Provisional Patent Application Ser. No. 60/802,993, filed on May 24, 2006, by Umesh K. Mishra, James S. Speck and Claude C. A. Weisbuch, entitled "IMPROVED LATERAL OVERGROWTH FOR LIGHT EMITTING DIODES (LEDS) AND LASERS";

U.S. Provisional Patent Application Ser. No. 60/809,774, filed on May 31, 2006, by Nicholas A. Fichtenbaum, Umesh K. Mishra, Carl J. Neufeld and Stacia Keller, entitled "OPTOELECTRONIC DEVICES FORMED BY REGROWTH ON N-POLAR NANOPILLAR AND NANOSTRIPE ARRAYS";

U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LED THROUGH MULTIPLE EXTRACTORS", U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES", U.S. Provisional Patent Application Ser. No. 60/866,015, filed on Nov. 15, 2006, by Aurelien J. F. David, Claude C. A. Weisbuch, Steven P. DenBaars and Stacia Keller, entitled "HIGH LIGHT EXTRACTION EFFICIENCY LED WITH EMITTERS WITHIN STRUCTURED MATERIALS", which applications are incorporated by reference herein.

BACKGROUND OF THE INVENTION

1. Field of the Invention

This invention is related to light emitting diode (LED) light extraction for optoelectronic applications. More particularly, the invention relates to an (Al, Ga, In)N and ZnO structure combined with optimized optics for highly efficient (Al, Ga, In)N-based LED applications, and its fabrication method. A further extension is the general combination of a shaped high refractive index light extraction material with a shaped optical element.

2. Description of the Related Art (Note: This application references a number of different publications as indicated throughout the specification. A list of these different publications can be found below in the section entitled "References." Each of these publications is incorporated by reference herein.)

Wafer bonding technology using different combinations of materials, such as InP/GaAs, AlGaInP/GaP, GaAs/GaN, ZnSSe/GaN, has been studied for applications such as optoelectronic integration, light emitting diodes (LEDs), vertical cavity surface emitting lasers (VCSELs), and electronic devices [1-4].

In a nitride LED system, there are several reports of fabricating transparent electrodes on a p-type gallium nitride (GaN) layer. The general method is to use thin metals of nickel (Ni) and Gold (Au) [5]. However, because of the light absorption in the metal, transmittance is only around 60%. Also, surface feature shaping for improving light extraction efficiency is difficult because of the hardness of GaN material and the instability of p-type GaN conductivity.

Another approach is to use zinc oxide (ZnO) layer growth on p-type GaN [6]. However, this method requires ZnO crystal growth equipment, which uses ultra-high vacuum conditions. Moreover, it is difficult to grow thick layers, e.g. 500 μm thick layers, that are suitable for feature shaping for the purpose of light extraction.

SUMMARY OF THE INVENTION

The present invention discloses an optoelectronic device, comprising an (Al, Ga, In)N based light emitting diode (LED), a first shaped optical element adjacent the LED for extracting light emitted by the LED, wherein the first shaped element is comprised of a high refractive index material, and a second shaped optical element, encapsulating or covering both the LED and first shaped optical element, for extracting light emitted by the LED and the first shaped optical element, wherein the second shaped optical element is comprised of a low refractive index material and the low refractive index material has a refractive index lower than the high refractive index material.

The first shaped optical element may be shaped so that most light entering the first shaped optical element from the LED lies within a critical angle for refraction into the one or more second shaped optical elements. The one or more second shaped optical elements may be shaped so that most light from the LED entering the one or more second shaped elements lies within a critical angle for refraction out of the one or more second optical elements.

The first shaped optical element may surround the LED, may be cone-shaped, for example a truncated hexagonal pyramid. The device may further comprise a plurality of first shaped optical elements. The second shaped optical element may be a plastic lens.

The high refractive index material may be selected to have a transparency greater than 60% and electrical conductivity sufficient to make ohmic contact with the LED.

The LED may comprise (Al, Ga, In)N and the high refractive index light extraction material may comprise ZnO wafer bonded to the (Al, Ga, In)N. The (Al, Ga, In)N may be polar c-face {0001} (Al, Ga, In)N, a-face {11-20} (Al, Ga, In)N, non-polar m-face {1-100}(Al, Ga, In)N, or semipolar (Al, Ga, In)N, wherein semipolar refers to a wide variety of planes that possess two nonzero h, i, or k Miller indices, and a nonzero l Miller index, {hikl}.

The LED may be comprised of (Al, Ga, In)N and the first shaped optical element may comprise ZnO wafer bonded to the (Al, Ga, In)N. The ZnO may be transparent and reduce light absorption inside the LED. Furthermore, the ZnO may be doped to emit other colors, such as blue, yellow, red, and white light, in addition to the LED's emission. The ZnO may be electrically conductive and enable uniform light emission from an active region in the LED.

The ZnO may be roughened or shaped, for example to reduce light reflections occurring repeatedly inside the LED and increase light extraction from the LED.

The LED may be comprised of (Al, Ga, In)N material, (Al, Ga, In)As material, (Al, Ga, In)P material, compound semiconductor material comprising (Al, Ga, In)AsPNSb material, or compound semiconductor material comprising $ZnGeN_2$ or $ZnSnGeN_2$ material. The LED may be grown on a sapphire, silicon carbide, silicon, germanium, gallium arsenide, gallium phosphide, indium phosphide, or spinel wafer, or on gallium nitride, or on free-standing gallium nitride removed from another substrate.

The high refractive index light extraction material may be comprised of GaN, SiC, SiON, SiN, $SiO_2$, high refractive index metal oxides, high refractive index polymers, high refractive index plastic material, silicone, glass, or quartz, or any composite of the above.

The present invention also discloses a method for fabricating a high light extraction efficiency light emitting diode (LED) structure, comprising wafer bonding a first optical element, comprising a transparent conductor, to an LED to form a wafer bonded structure, shaping the first optical element to maximize refraction of light into a second optical element, and encapsulating or covering the wafer bonded structure with the second optical element, wherein the second optical element has a refractive index lower than the refractive index of the first optical element and is shaped to maximise refraction of light out of the second optical element.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes an (Al, Ga, In)N and ZnO direct wafer bonded light emitting diode (LED), combined with a shaped plastic optical element, in which the directional light entering the shaped plastic optical element from a ZnO cone, or any high refractive index material in contact with the LED surface, is extracted to air. In particular, the (Al, Ga, In)N and ZnO direct wafer-bonded LED structure is combined with a tapered lens, in which most of the light entering the lens lies within the critical angle and is extracted.

The present invention reduces the absorption from neighboring cones by reducing the number of cones to one. The present invention reduces reflection from the plastic encapsulant surface, reduces reflections from the ZnO surface, reduces light absorption inside the LED, enables uniform light emission from the active layer, and reduces light reflections occurring repeatedly inside the LED. As a result, this combined structure extracts more light out of the LED compared to LEDs described in the prior art.

Technical Description

The purpose of the present invention is to provide a means of increasing the light extraction efficiency from an LED, by combining shaped high refractive index elements with an (Al, Ga, In)N LED and shaped optical elements. By increasing light transmittance and light extraction, subsequent device performance is increased.

In one embodiment of the present invention, a high refractive index ZnO layer is wafer bonded to a GaN LED. A cone is etched in the high refractive index ZnO layer and contacts are fabricated on the GaN LED. The ZnO/GaN hybrid LED is then placed within a plastic lens that has a conical shape with an angle of approximately 45 degrees.

Figure 1:
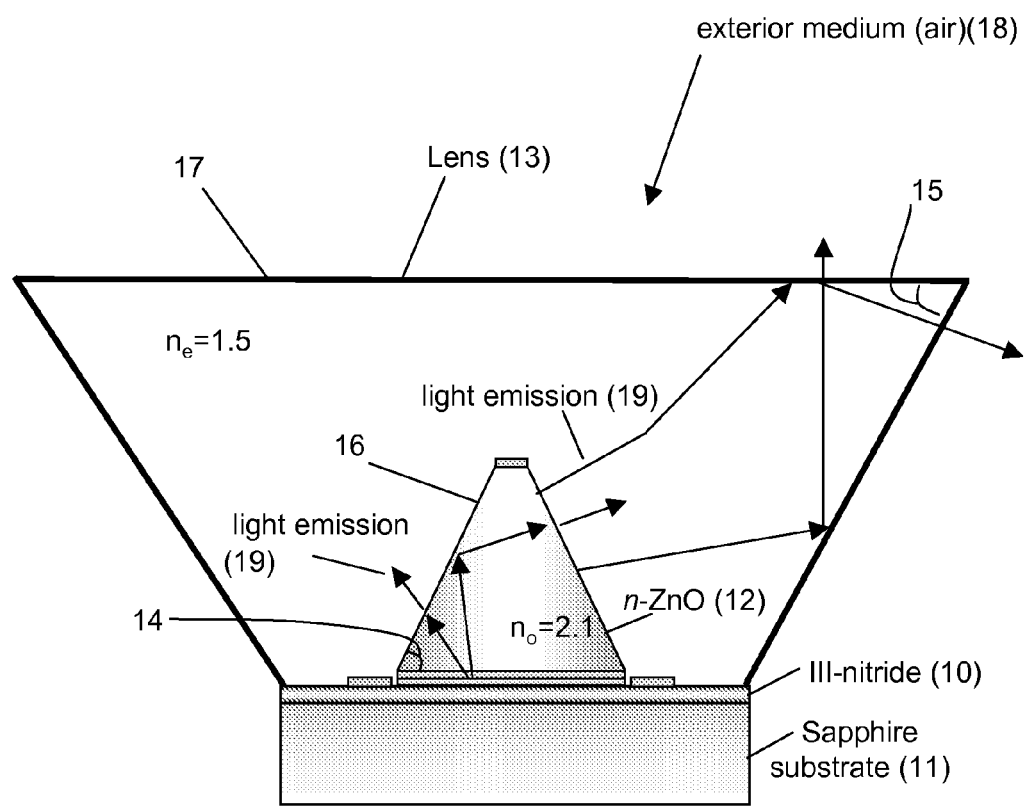
FIG. 1 is a schematic cross-section of an (Al, Ga, In)N and ZnO direct wafer-bonded LED structure combined with a tapered lens, in which most light entering the lens lies within the critical angle and is extracted.

FIG. 1 shows a schematic representation of a high light extraction efficiency LED according to the preferred embodiment of the present invention. Generally, the LED is an (Al, Ga, In)N and ZnO direct wafer-bonded LED structure. In this example, the LED (10) is comprised of n-type III-nitride layer(s), active layer(s), and p-type III-nitride layer(s) on a substrate (11) such as a sapphire substrate. A first shaped optical element, comprising an n-type ZnO cone (12) having an index of refraction $n_0=2.1$, resides on top of the LED (10). Both the LED and the n-ZnO cone (12) are encapsulated within, under, or covered by, a second optical element, comprising a tapered or conical plastic lens (13) having an index of refraction $n_e=1.5$. The cone (12) is inverted relative to the conical lens (13).

The angles (14) of the cone (12) and the angles (15) of the conical plastic lens (13) are critical angles ($\theta_c$) and may be adjusted as desired. If the critical angle $\theta_c$ (14) of the ZnO cone is approximately 60°, most light makes it out on the first pass, since the majority of the light is within the escape cone (i.e., most light impinges on the interface (16) at an angle equal to or smaller than $\theta_c$).

The critical angles (14), (15) are given by the arctangent of a ratio of refractive indices at an interface (16) between the first shaped optical element and second shaped optical element, or an interface (17) between the second shaped optical element and an exterior medium (18), respectively, wherein the ratio is given by refractive index on one side of interface divided by the refractive index on the other side of the interface. For example, an air/plastic interface has a ratio 1/1.5 yielding $\theta_c=42°$, a plastic/ZnO interface has a ratio 1.5/2.1 yielding $\theta_c=46°$, a ZnO/GaN interface has a ratio 2.1/2.3 yielding $\theta_c=66°$ and an air/ZnO interface has a ratio 1/2.1 yielding $\theta_c=28°$. The arrows (19) in FIG. 1 indicate possible trajectories for light emitted by the LED (10) into the cone (12) and extracted into air.

The first optical element (12) is shaped with a critical angle (14) so that most light entering the first shaped optical element (12) from the LED (10), impinges on an interface (16) of the one or more second shaped optical elements within the critical angle for refraction into the one or more second shaped optical elements. The second shaped optical element (13) is shaped with a critical angle (15) so that most light from the LED, that is transmitted through the first and second shaped optical elements, impinges on an interface (17) of an exterior medium (18) (such as air, for example) within the critical angle for refraction out of the one or more second shaped optical elements (13).

Figure 2:
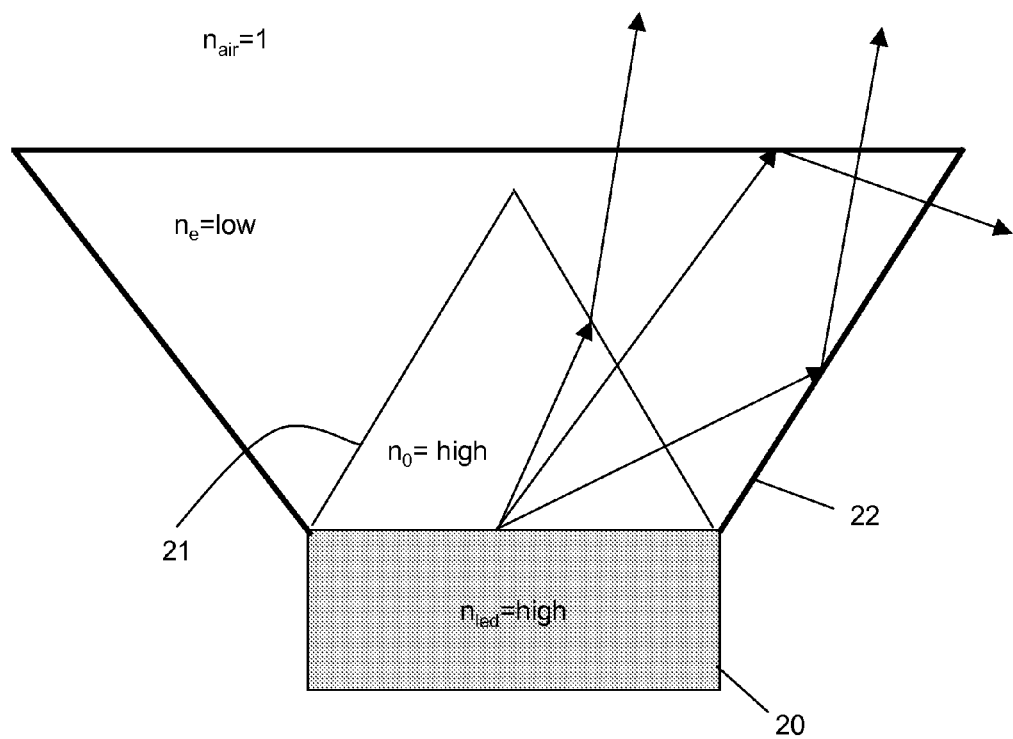
FIG. 2 is a more general concept in which any high refractive index material, such as SiON, $SiO_2$, ZnS, GaN, SiC, or high refractive index polymer or plastic, can be combined with a second optical element.

FIG. 2 shows a schematic representation of a high light extraction efficiency LED according to the preferred embodiment of the present invention. FIG. 2 shows the preferred relationships between the index of refraction for the LED, $n_{led}$, the index of refraction for the cone, $n_o$, and the index of refraction for the lens, $n_e$. More specifically, FIG. 2 illustrates the concept of the present invention of providing for high light extraction efficiency by combining an (Al, Ga, In)N based LED (20), a first "shaped" optical element (21), (e.g., the cone) comprised of high refractive index material, that is adjacent to, on the surface of, or surrounding the (Al, Ga, In)N LED (20), and a second "shaped" optical element (22) (e.g., the lens), comprised of low refractive index material, that encapsulates or covers both the (Al, Ga, In)N LED (20) and the first shaped optical element (21). In general, the refractive index of the high refractive index material, no, is larger than the refractive index of the lower refractive index material, $n_e$, i.e. $n_o > n_e$. The arrows in FIG. 2 indicate possible trajectories for light emitted by the LED (20).

Figure 3A:
FIGS. 3(*a*) and 3(*b*) illustrate a ZnO conical LED combined with tapered optics.
Figure 3B:
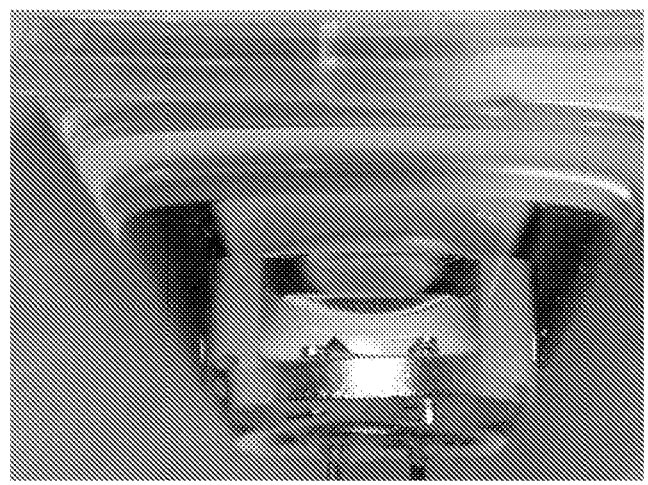

FIGS. 3(a) and 3(b) comprise photographs showing an LED with a first shaped optical element comprising a ZnO cone, and second shaped optical element, comprising a tapered lens (31), according to the preferred embodiment of the present invention, emitting bright blue light while under forward bias.

The combined conical LED with tapered conical plastic lens LED has been observed to have an output power of 22 mW for a 460 nm emission wavelength, and at 20 mA drive current. This demonstrates an approximately 500% increase in light output over the conventional GaN chip processed from the same epitaxial wafer.

Figure 4:
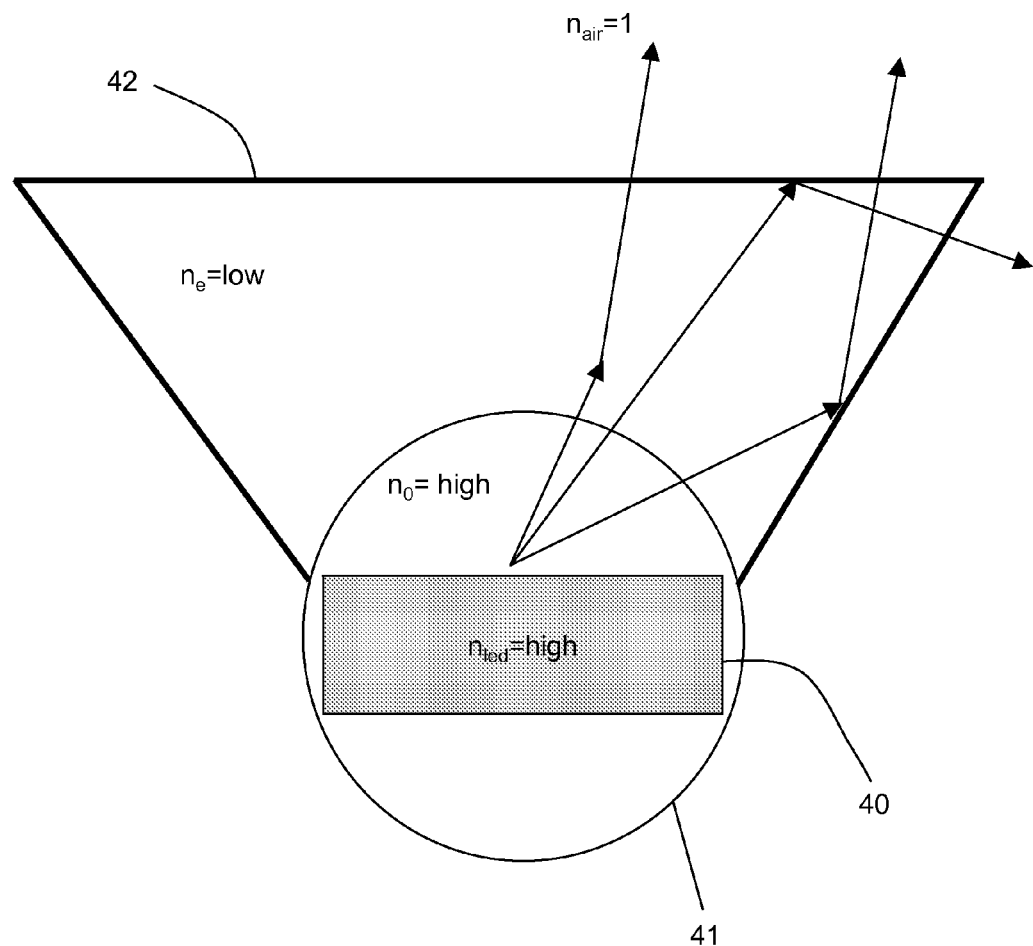
FIG. 4 is a schematic cross-section of an LED with shaped high refractive index material on both sides.

FIG. 4 illustrates an exemplary embodiment of an LED (40), with a first shaped optical element (41) of high refractive index material on both sides of, and surrounding the LED (40), and a tapered lens (42). The arrows in FIG. 4 indicate possible trajectories for light emitted by the LED (40).

Figure 5:
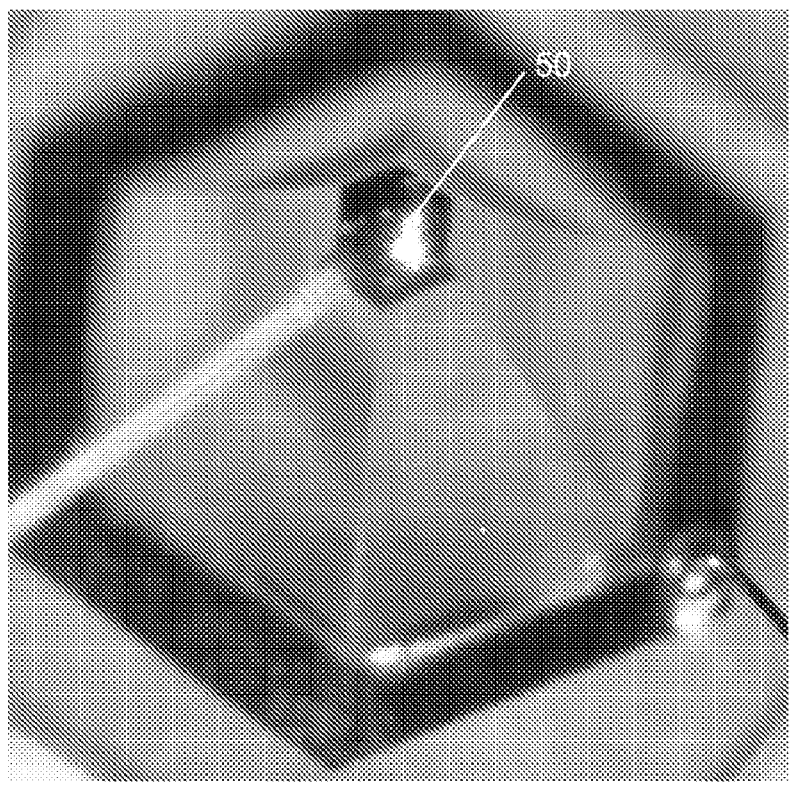
FIG. 5 illustrates a ZnO conical shaped wafer bonded LED.

FIG. 5 is a photograph that shows a ZnO conical shaped wafer bonded LED with an electrical contact (50).

Figure 6:
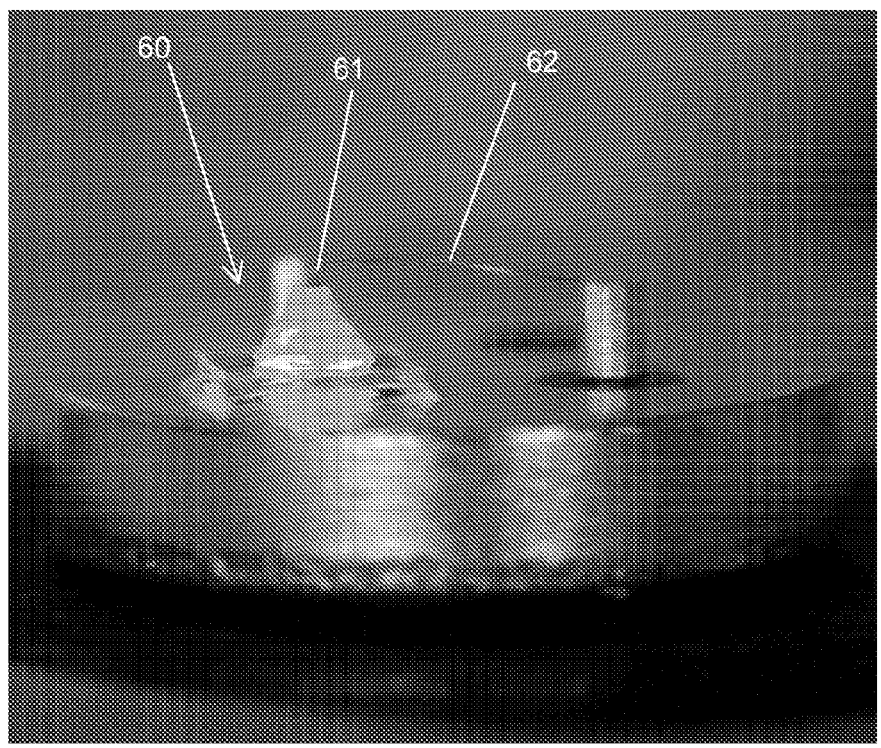
FIG. 6 illustrates a ZnO conical shaped wafer bonded LED under 2 mA forward current.

FIG. 6 is a photograph that shows a ZnO conical shaped wafer bonded LED (60), emitting blue light while, under 2 mA forward current passed through the electrical contact (61) and wire (62).

Figure 7:
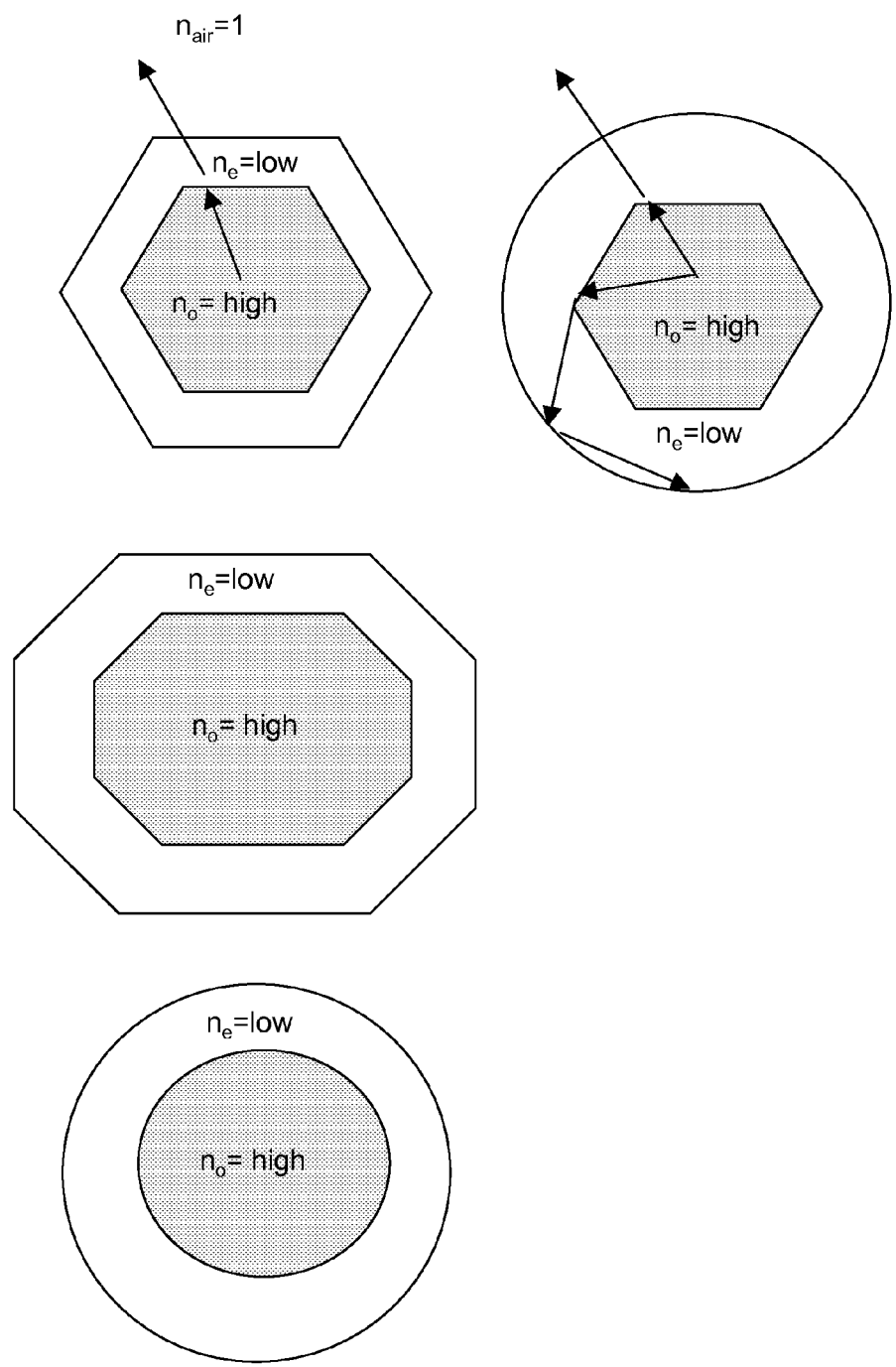
FIG. 7 is a top view of shaped high refractive index extractors in combination with shaped plastic optical elements.

FIG. 7 illustrates various combinations and geometries that could be used for the first and second shaped optical elements, which are identified by their respective high and low refractive indices. The arrows indicate possible trajectories for light emitted by an LED encapsulated in the first shaped optical element. The first shaped optical element, comprising high refractive index material, is for extracting light emitted by the LED, and the second shaped optical element, comprising low refractive index, is for extracting light emitted by the LED and the first shaped optical element.

Figure 8:
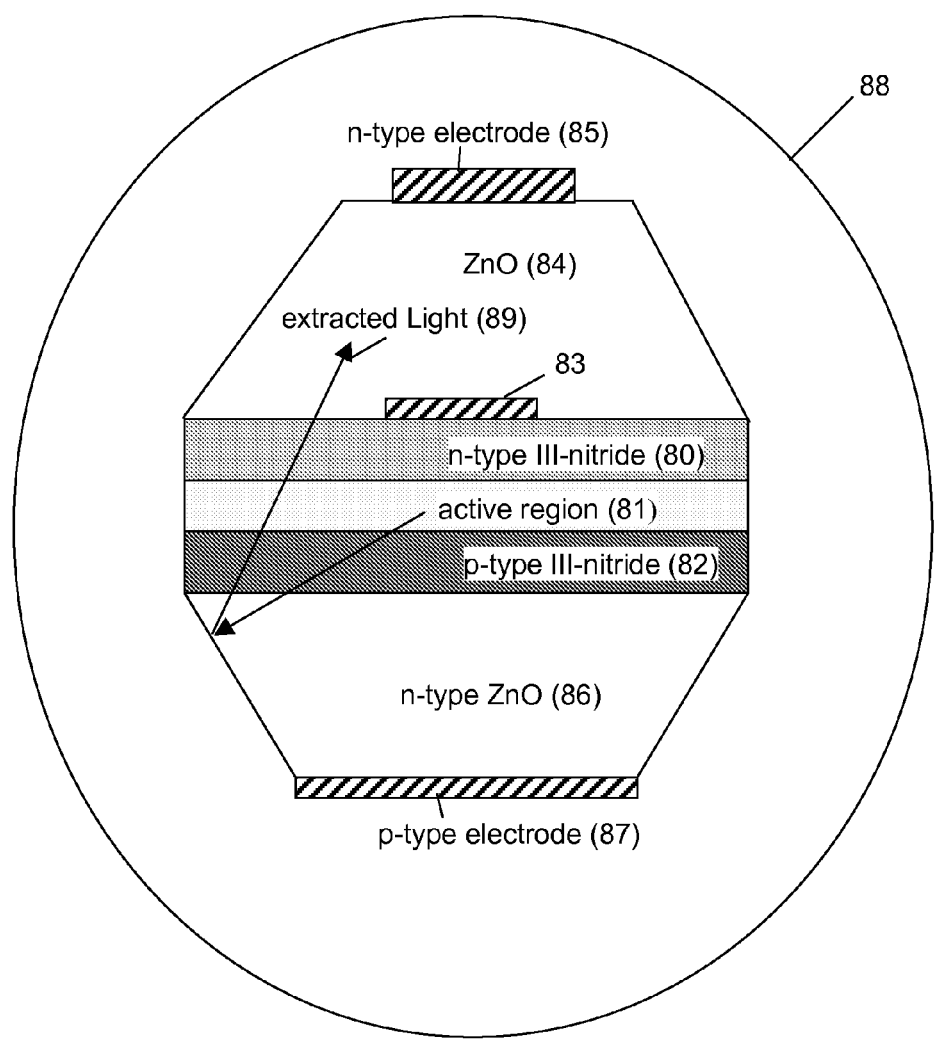
FIG. 8 is a shaped LED with a high refractive index extractor on both sides of the LED and a spherical plastic optical element.

FIG. 8 is a schematic representation of a high light extraction efficiency LED, according to an exemplary embodiment of the present invention. The LED comprises an n-type III-nitride layer (80), active region (81) and p-type III-nitride layer (82). Adjacent the n-type III-nitride layer (80) is an electrode (83) and a first ZnO cone-shaped element (84). On top of the first ZnO cone (84) is an n-type electrode (85). Adjacent the p-type III-nitride layer (82) is a second n-type ZnO cone-shaped element (86) with a p-type electrode (87) on top of the ZnO (86). Thus, the LED comprises first shaped optical elements comprising high refractive index light extractors (e.g., the first (84) and second (86) ZnO cone-shaped elements) on both sides. The outer circle (88) represents the second shaped optical element comprising the lens. The arrows (89) indicate possible trajectories for light emitted from the active region (81) of the LED.

Figure 9:
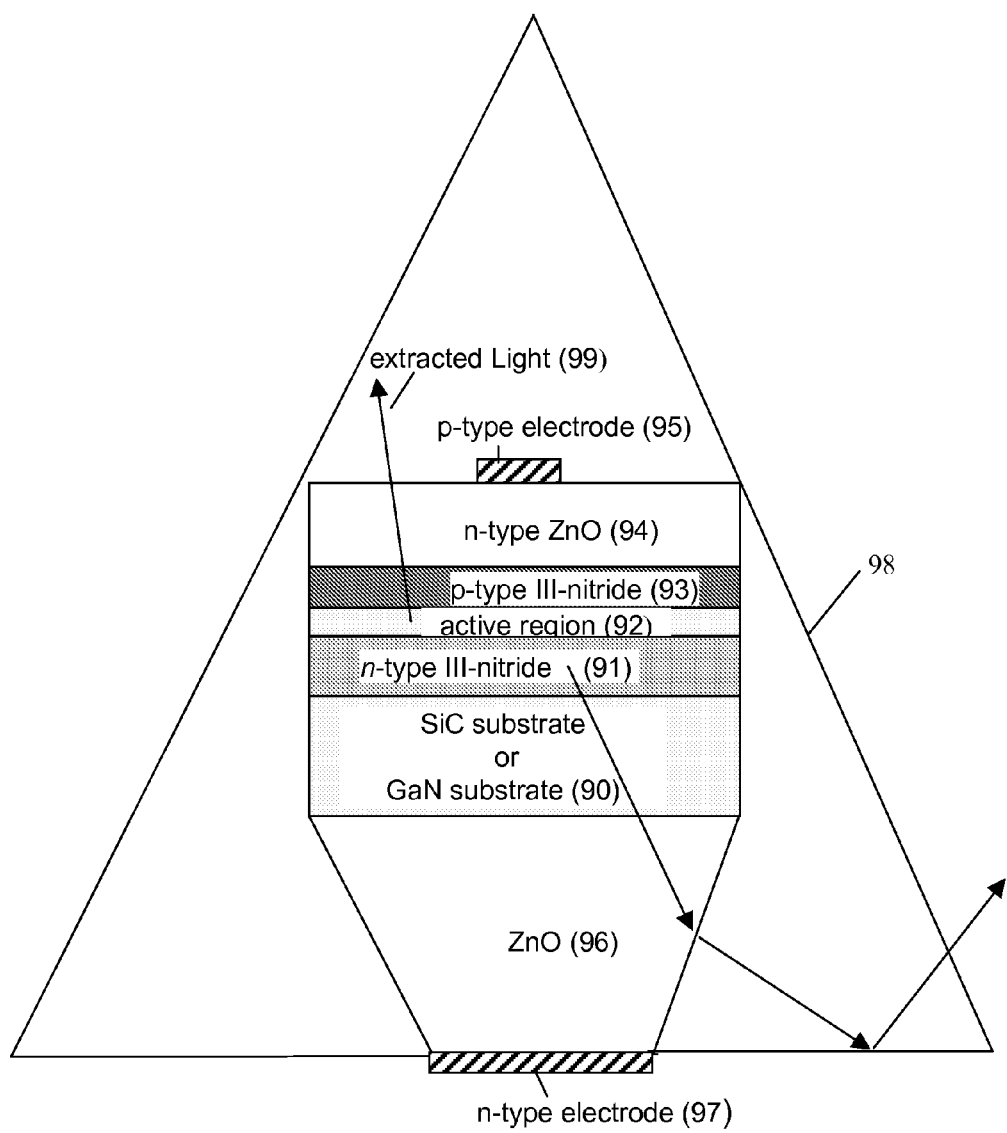
FIG. 9 is a schematic cross-section of a wafer-bonded LED, having ZnO or a transparent conductor (such as ITO) on both sides of the device, combined with shaped optical elements.

FIG. 9 is a schematic representation of a high light extraction efficiency LED according to an exemplary embodiment of the present invention. The LED comprises a SiC or GaN substrate (90), an n-type III-nitride layer (91), active region (92) and p-type III-nitride layer (93). Adjacent the p-type III-nitride layer (93) is an n-type ZnO layer (94), and there is a p-type electrode (95) on top of the ZnO (94). Adjacent the substrate (90) is a ZnO cone-shaped element (96), and there is an n-type electrode (97) on the ZnO (96). The outer triangle (98) represents the lens, and arrows (99) represent possible trajectories for light emitted from the LED.

Figure 10:
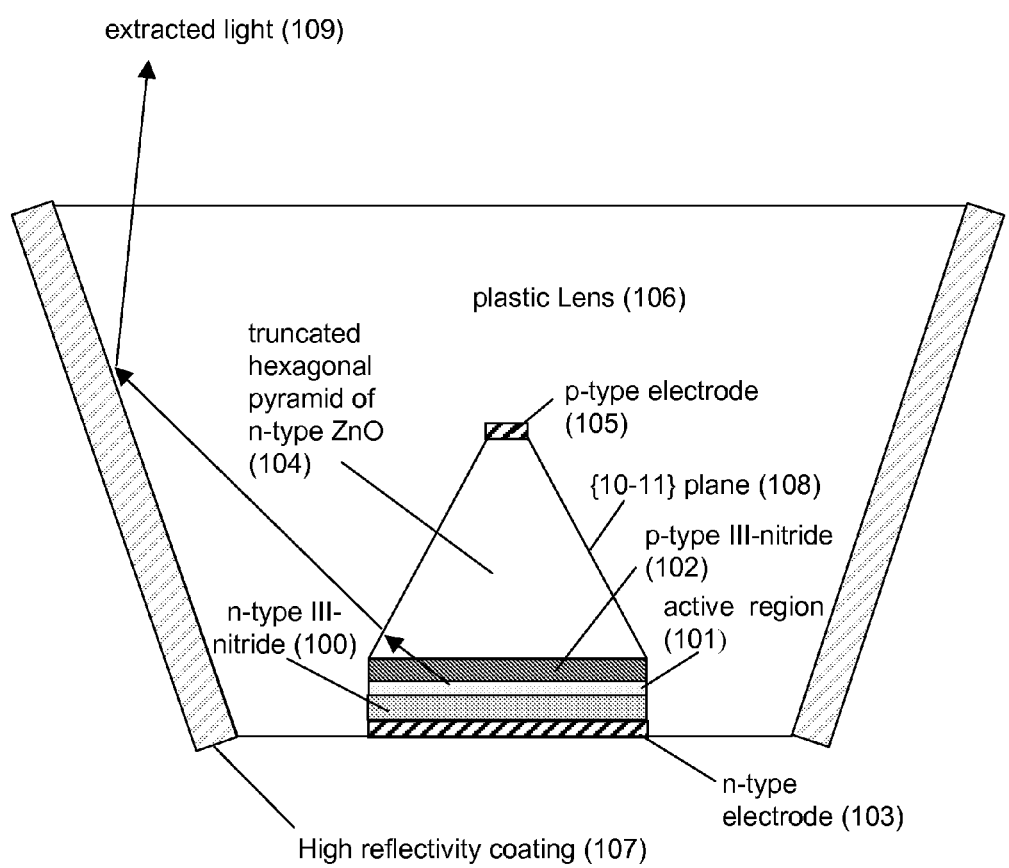
FIG. 10 is a schematic of a conical shaped LED with a tapered optics design for high light extraction in the forward direction.

FIG. 10 is a schematic representation of a high light extraction efficiency LED according to an exemplary embodiment of the present invention. The LED comprises an n-type III-nitride layer (100), active region (101) and p-type III-nitride layer (102). Adjacent the n-type III-nitride layer (100) is an n-type electrode (103). Adjacent the p-type III-nitride layer (102) is an n-type ZnO cone-shaped element (104) comprising a truncated hexagonal pyramid, and there is a p-type electrode (105) on top of the ZnO (104). The outer trapezoid (106) represents the plastic lens and the lens may have a high reflectivity coating (107). The ZnO cone (105) may be a truncated hexagonal pyramid with {10-11} plane surfaces (108), for example. The arrows (109) indicate possible trajectories for light emitted by the LED.

Figure 11:
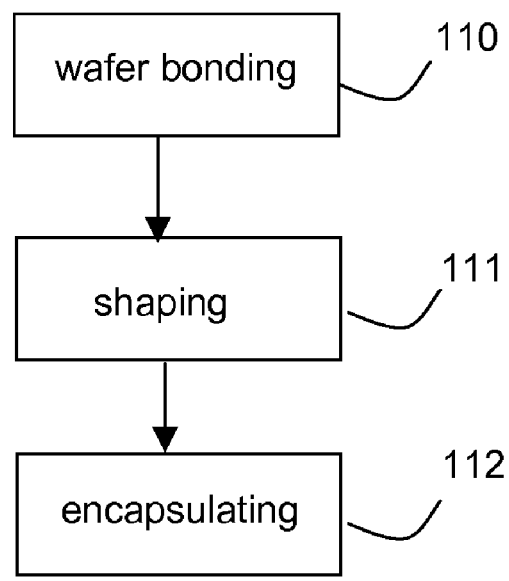
FIG. 11 is a flowchart, illustrating a method for fabricating a high light extraction efficiency light emitting diode (LED) structure.

FIG. 11 represents a method for fabricating a high light extraction efficiency light emitting diode (LED) structure.

Block 110 represents the step of wafer bonding a first optical element, comprising a transparent conductor, to an LED to form a wafer bonded structure.

Block 111 represents the step of shaping the first optical element to maximize refraction of light into a second optical element.

Block 112 represents the step of encapsulating or covering the wafer bonded structure with the second optical element, wherein the second optical element has a refractive index lower than the refractive index of the first optical element, and is shaped to maximise refraction of light out of the second optical element.

Possible Modifications

The advantages of the present invention derive from bonding and shaping (Al, Ga, In)N and ZnO LED structures in combination with optics designed to extract the light emitting from shaped surfaces. This combination is novel and has advantages over existing device designs, especially for LED applications.

The III-nitride LED may be comprised of, for example, (Al, Ga, In)N materials, (Al, Ga, In)As materials, (Al, Ga, In)P materials, compound semiconductor material made from (Al, Ga, In)AsPNSb materials, or compound semiconductor material from $ZnGeN_2$ or $ZnSnGeN_2$ materials.

With regard to the (Al, Ga, In)N materials, the LED may be comprised of polar c-face {0001} (Al, Ga, In)N, a-face {11-20}, non polar m-face {1-100} (Al, Ga, In)N, or semipol (Al, Ga, In)N, wherein semipolar refers to a wide variety of planes that possess two nonzero h, i, or k Miller indices, and a nonzero l Miller index, {hikl}.

In addition, the LED may be grown on, for example, a sapphire, silicon carbide, silicon, germanium, gallium arsenide, gallium phosphide, indium phosphide, or spinel wafer, or on gallium nitride, or on free-standing gallium nitride removed from other substrates.

The high refractive index materials may be comprised of many different materials, for example, ZnO, GaN, SiC, SiON, SiN, $SiO_2$, high refractive index metal oxides, high refractive index polymers, or high refractive index plastic material. The low refractive index materials may also be comprised of many different types of materials, for example, plastics. These materials may be roughened or shaped using any number of different methods.

In general, the first shaped optical element may comprise any high refractive index material selected to have a transparency greater than 60% and electrical conductivity sufficient to make ohmic contact with the LED. The ZnO used throughout this disclosure may be n type, p type or undoped, adjacent any doped semiconductor layer (i.e., n-type ZnO adjacent p-type semiconductor or n-type semiconductor, or p-type ZnO adjacent p-type or n-type semiconductor).

As noted above, in one embodiment, the LED is comprised of (Al, Ga, In)N layers and the high refractive index light extraction materials are comprised of ZnO layers that are wafer bonded to the (Al, Ga, In)N layers. The shaped or roughened ZnO reduces light reflections occurring repeatedly inside the LED, and thus extracts more light out of the LED. The highly transparent characteristic of ZnO (more than 60%) reduces light absorption inside the LED. The electrically conductive characteristic of ZnO enables uniform light emission from the active region in an LED. The resulting external quantum efficiency of this new hybrid GaN/ZnO/shaped lens design should be higher than that of existing GaN-based LED devices.

The ZnO may be doped to emit other colors, such as blue, yellow, red, and white light, in addition to the LED's emission.

Moreover, the combination of a transparent ZnO electrode with a nitride LED grown on electrically conductive substrates, such as SiC or GaN, can reduce the number of process steps required for the fabrication of LEDs, because an electrode can be easily formed on the electrically conductive material. However, in other embodiments, the ZnO does not have to be necessarily wafer bonded, but could be deposited by a wide variety of means instead.

Finally, with regard to the number of cones or other shaped optical elements, smaller numbers are better, because each cone could absorb the emission from the next cone. When there is only one cone, there are no effects, such as absorption, from another neighboring cone, because there are no other cones. Further information on multi-cone LEDs can be found in [7].

The advantage of the present invention is that it greatly increases the light extraction efficiency in comparison to a standard square GaN chip. Table I below shows that the same epitaxial material fabricated with the current invention yields an output power of 15-22 mW emitting at 460 nm wavelength, under a 20 mA drive current, which is approximately a 500% increase over the standard square chip power of 4-5 mW at 20 mA.

TABLE I

| Process | Output Power (20 mA current supplied) | Light extraction efficiency |
| --- | --- | --- |
| Conventional GaN chip | 4-4.5 mW | 15% |
| ZnO cone/GaN LED | 9-11 mW | 30% |
| ZnO cone/GaN and plastic Shaped lens | 15-22 mW | 56-73% |

REFERENCES

The following references are incorporated by reference herein:
[1] Appl. Phys. Lett. 56, 737-39 (1990).
[2] Appl. Phys. Lett. 64, 2839-41 (1994).
[3] Appl. Phys. Lett. 81, 3152-54 (2002).
[4] Jpn. J. Appl. Phys. 43, L1275-77 (2004).
[5] J. J. Appl. Phys. 34, L797-99 (1995).
[6] J. J. Appl. Phys. 43, L 180-82 (2004)
[7] Appl. Phys. Lett. 84, 855 (2004).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:
1. An optoelectronic device, comprising:
  (a) a light emitting diode (LED) comprised of an n-type layer having an n-type electrode, an active region, a p-type layer, and n-type ZnO bonded to the p-type layer, wherein the n-type ZnO comprises a first shaped optical element that is shaped as an n-type ZnO cone for extracting light emitted by the active region, a base of the n-type ZnO cone is bonded to the p-type layer, an angle between the base and sidewalls of the n-type ZnO cone is a critical angle, and a p-type electrode is placed on top of the n-type ZnO cone; and
  (b) a second shaped optical element inverted relative to the n-type ZnO cone and forming an interface with the sidewalls of the n-type ZnO cone, wherein the second shaped optical element's cross-section is a trapezoid, the interface extracts light emitted by the active region into the second shaped optical element because the second shaped optical element on one side of the interface has a refractive index lower than a refractive index of the n-type ZnO cone on the other side of the interface, the critical angle is determined from the refractive index of the second shaped optical element divided by the refractive index of the n-type ZnO cone, and most light entering the n-type ZnO cone from the active region impinges on the interface within the critical angle for refraction into the second shaped optical element, so that the trapezoid and the n-type ZnO cone provide at least a 500% increase in output power.

2. The device of claim 1, wherein the first shaped optical element surrounds the LED.

3. The device of claim 1, wherein the first shaped optical element is a truncated hexagonal pyramid.

4. The device of claim 1, further comprising a plurality of first shaped optical elements.

5. The device of claim 4, wherein the second shaped optical element is a plastic lens.

6. The device of claim 1, wherein the n-type ZnO cone is selected to have a transparency greater than 60% and electrical conductivity sufficient to make ohmic contact with the LED.

7. The device of claim 1, wherein the active region, the n-type layer, and the p-type layer are comprised of (Al, Ga, In)N and the first shaped optical element comprises an n-type ZnO truncated cone.

8. The device of claim 7, wherein the LED is comprised of polar c-face {0001} (Al, Ga, In)N, a-face {11-20} (Al, Ga, In)N, non-polar m-face {1-100} (Al, Ga, In)N, or semipolar (Al, Ga, In)N, wherein semipolar refers to a wide variety of planes that possess two nonzero h, i, or k Miller indices, and a nonzero /Miller index, {hikl}.

9. The device of claim 7, wherein the n-type ZnO cone is transparent and reduces light absorption inside the LED.

10. The device of claim 7, wherein the n-type ZnO cone is doped to emit other colors, including blue, yellow, red, and white light, in addition to the LED's emission.

11. The device of claim 7, wherein the n-type ZnO cone is electrically conductive and enables uniform light emission from an active region in the LED.

12. The device of claim 7, wherein the n-type ZnO cone is roughened.

13. The device of claim 12, wherein the roughened n-type ZnO cone reduces light reflections occurring repeatedly inside the LED, and thus extracts more light out of the LED.

14. The device of claim 1, wherein the n-type layer, the p-type layer, and active region of the LED are comprised of (Al, Ga, In)N material, (Al, Ga, In)As material, (Al, Ga, In)P material, compound semiconductor material comprising (Al, Ga, In)AsPNSb material, or compound semiconductor material comprising $ZnGeN_2$ or $ZnSnGeN_2$ material.

15. The device of claim 1, wherein the LED is grown on a sapphire, silicon carbide, silicon, germanium, gallium arsenide, gallium phosphide, indium phosphide, or spinel wafer, or on gallium nitride, or on free-standing gallium nitride removed from another substrate.

16. The device of claim 1, wherein materials and shapes of the first shaped optical element and the second shaped optical element are such that refraction into the second shaped optical element and into the exterior medium leads to an extraction efficiency out of the optoelectronic device of at least 56%.

17. The device of claim 1, further comprising an angle that is a critical angle, between a base of the trapezoid, that is an exterior interface between the second shaped optical element and the exterior medium, and a sidewall of the trapezoid, wherein the critical angle is determined from a refractive index on one side of the exterior interface divided by a refractive index on the other side of the exterior interface, so that most light entering the second shaped optical elements impinges on the exterior interface within the critical angle for refraction out of the second shaped optical element.

18. A method for fabricating a high light extraction efficiency light emitting diode (LED) structure, comprising:
(a) wafer bonding a first optical element, comprising n-type ZnO, to a p-type layer of an LED, to form a wafer bonded structure, wherein the LED is comprised of an n-type layer having an n-type electrode, an active region, the p-type layer, and the n-type ZnO;
(b) shaping the first optical element into an n-type ZnO cone to extract light emitted by the active region, wherein a base of the n-type ZnO cone is bonded to the p-type layer, and an angle, between a base and sidewalls of the n-type ZnO cone, is a critical angle;
(c) placing a p-type electrode on top of the n-type ZnO cone; and
(d) forming an interface between the sidewalls of the n-type ZnO cone and a second optical element, wherein the second optical element's cross-section is a trapezoid, the interface extracts light emitted by the active region into the second shaped optical element because the second shaped optical element on one side of the interface has a refractive index lower than a refractive index of the n-type ZnO cone on the other side of the interface, the critical angle is determined from the refractive index of the second shaped optical element divided by the refractive index of the n-type ZnO cone, and most light entering the n-type ZnO cone from the active region impinges on the interface within the critical angle for refraction into the second shaped optical element, so that the trapezoid and the n-type ZnO cone provide at least a 500% increase in output power.

19. The method of claim 18, further comprising an angle that is a critical angle, between a base of the trapezoid, that is an exterior interface between the second shaped optical element and the exterior medium, and a sidewall of the trapezoid, wherein the critical angle is determined from a refractive index on one side of the exterior interface divided by a refractive index on the other side of the exterior interface, so that most light entering the second shaped optical element impinges on the exterior interface within the critical angle for refraction out of the second shaped optical element.

20. The method of claim 18, wherein materials and shapes of the first shaped optical element and the second shaped optical element are such that refraction into the second shaped optical element and into the exterior medium leads to an extraction efficiency out of the optoelectronic device of at least 56%.

* * * * *